(12) United States Patent
Fu

(10) Patent No.: US 9,134,615 B2
(45) Date of Patent: Sep. 15, 2015

(54) EXPOSURE METHOD FOR GLASS SUBSTRATE OF LIQUID CRYSTAL DISPLAY

(71) Applicant: Shenzhen China Star Optoelectronics Technology Co., Ltd., Shenzhen, Guangdong (CN)

(72) Inventor: Yanfeng Fu, Guangdong (CN)

(73) Assignee: Shenzhen China Star Optoelectronics Technology Co., Ltd, Shenzhen, Guangdong (CN)

( * ) Notice: Subject to any disclaimer, the term of this patent is extended or adjusted under 35 U.S.C. 154(b) by 0 days.

(21) Appl. No.: 14/346,423

(22) PCT Filed: Jan. 9, 2014

(86) PCT No.: PCT/CN2014/070383
§ 371 (c)(1),
(2) Date: Mar. 21, 2014

(87) PCT Pub. No.: WO2015/100775
PCT Pub. Date: Jul. 9, 2015

(65) Prior Publication Data
US 2015/0192823 A1   Jul. 9, 2015

(30) Foreign Application Priority Data

Dec. 31, 2013  (CN) .......................... 2013 1 0747958

(51) Int. Cl.
*G02F 1/133* (2006.01)
*G03F 7/20* (2006.01)
*G02F 1/1333* (2006.01)

(52) U.S. Cl.
CPC ........ *G03F 7/2022* (2013.01); *G02F 1/133308* (2013.01); *G03F 7/70475* (2013.01); *G02F 2001/133302* (2013.01); *G02F 2001/133322* (2013.01)

(58) Field of Classification Search
CPC .............. G03F 7/2022; G03F 7/70475; G02F 1/133308; G02F 2001/133302; G02F 2001/133322
USPC ............................... 430/22, 30, 394
See application file for complete search history.

(56) References Cited

U.S. PATENT DOCUMENTS 6,699,630 B2 *   3/2004   Ota ................................. 430/30

* cited by examiner

*Primary Examiner* — Christopher Young
(74) *Attorney, Agent, or Firm* — Andrew C. Cheng

(57) ABSTRACT

An exposure method for an LCD glass substrate is revealed and includes: providing at least two photo masks, wherein each the photo mask includes active and inactive area with alignment-precision measurement-and-check marks disposed around the active area; performing exposure with each the photo mask on a separate reference substrate at a corresponding position, performing measurement of the alignment-precision measurement-and-check marks formed on the reference substrate, determining whether to modify a parameter of the exposure based on the measurement result, and obtaining accurate exposure parameter of each the photo mask; and combining the accurate exposure parameter of each the photo mask, using the combined exposure parameter to perform exposure sequentially with the at least two photo masks on the same substrate at corresponding positions, thereby obtaining an exposed pattern. Accordingly, the alignment precision between the TFT array and color filter substrates is enhanced and the LCD-panel production yield is increased.

12 Claims, 8 Drawing Sheets

EXPOSURE METHOD FOR GLASS SUBSTRATE OF LIQUID CRYSTAL DISPLAY

CROSS REFERENCE TO RELATED APPLICATIONS

The present application claims priority to Chinese Patent Application No. 201310747958.2, filed Dec. 31, 2013, and entitled "EXPOSURE METHOD FOR GLASS SUBSTRATE OF LIQUID CRYSTAL DISPLAY". The entire contents of the above-mentioned patent application are cited and incorporated herein for reference.

FIELD OF THE INVENTION

The present invention relates to a manufacturing technique of a thin film transistor liquid crystal display (TFT-LCD), and more particularly to an exposure method for a glass substrate of a liquid crystal display.

BACKGROUND OF THE INVENTION

With the rapid development of thin film transistor liquid crystal displays, the dimension of a liquid crystal display can be getting larger and larger. Consequently, it happens in an exposure process that the size of the pattern on a single large-size glass substrate is larger than that of a photo mask. Under this circumstance, it is necessary to device the pattern of the photo mask into a plurality of portions for multiple exposure operations on the single large-size glass substrate. The plurality of portions of photo mask pattern are then joined to construct the pattern on the single large-size glass substrate.

FIG. 1 through FIG. 3, for example, are schematic diagrams illustrating the combination and exposure on a single large-size glass substrate with a plurality of portions of photo mask according to prior art. As shown, two portions of photo mask are used, wherein each of the photo mask portions include an active area (Area A or Area B) and an inactive area (Area A' or Area B'). In the inactive area, alignment precision measurement and check marks (total pitch marks), which are shown as small blocks in the figures, are provided for measuring deflection or deformation level of the pattern on the substrate having been subjected to exposure, compared with the pattern in original design. As two exposure operations are conducted on the glass substrate 9 with two photo mask portions, a stitching exposure region 90 would appear. Since the stitching exposure region is in the active area, and the total pitch mark is much larger than a pixel in the active area, for each of the two exposed regions subjected to two exposure and jointing operations, no total pitch mark can be defined at the side of the stitching exposure region. As such, no alignment precision information can be measured for each of the two exposed regions at the side of the stitching exposure region, so the pattern deflection and deformation level cannot be monitored herein. Thus the TFT array substrate might misalign with the color filter substrate, and defects, e.g. light leakage problem, of the LCD might occur.

SUMMARY OF THE INVENTION

The present invention aims to solve the technical problems and provides an exposure method for a glass substrate of a liquid crystal display, which is able to enhance the alignment precision between the TFT array substrate and the color filter substrate and increase the production yield of LCD panels.

It is to reduce cost while improving the property of an array substrate.

In order to solve the above problems, the present invention in one aspect provides an exposure method for a glass substrate of a liquid crystal display, which comprises:

providing at least two photo masks, wherein each the photo mask includes an active area and an inactive area, the active area includes an overlap region corresponding to a stitching region of the glass substrate at a side thereof, and a plurality of alignment precision measure and check marks are disposed around the active area;

performing exposure with each the photo mask on a separate reference substrate at a corresponding position, performing measurement of the alignment precision measure and check marks formed on the reference substrate, determining whether it is necessary to modify a parameter of the exposure based on the measurement result, and obtaining accurate exposure parameter and position information of each the photo mask; and combining the accurate exposure parameter of each the photo mask, using the combined exposure parameter to perform exposure sequentially with the at least two photo masks on the same substrate at positions corresponding to the position information so as to obtain an exposed pattern, wherein for each the exposure, at least one cover plate is used to shield the alignment precision measure and check marks of the photo mask at the side of the overlap region.

In the method, the step of performing exposure with each the photo mask on a separate reference substrate at a corresponding position, performing measurement of the alignment precision measure and check marks formed on the reference substrate, determining whether it is necessary to modify a parameter of the exposure based on the measurement result, and obtaining accurate exposure parameter and position information of each the photo mask further includes:

comparing the measurement result with a target value, and using the newest exposure parameter of the photo mask as the accurate exposure parameter if the comparing result indicates a deviation within an acceptable range; and modifying a current exposure parameter of the photo mask and performing exposure again if the comparing result indicates a deviation beyond the acceptable range, until the comparing result indicates a deviation within the acceptable range, and using the newest exposure parameter of the photo mask as the accurate exposure parameter.

In the method, the exposed pattern includes at least two exposure regions corresponding to the at least two photo masks, and the stitching region is formed between adjacent two of the exposure regions.

In the method, the glass substrate is a thin film transistor array substrate or a color filter substrate.

In the method, each the reference substrate has the same dimension as the glass substrate.

In the method, the step of performing exposure with each the photo mask on a separate reference substrate at a corresponding position further includes:

performing a process of etching the reference substrate and removing photoresist after exposure.

In the method, the step of performing exposure sequentially with the at least two photo masks on the same substrate at corresponding positions according to corresponding accurate exposure parameters further includes:

aligning the photo mask with the glass substrate before each exposure is performed.

Correspondingly, the present invention in another aspect provides an exposure method for a glass substrate of a liquid crystal display, which comprises:
} providing at least two photo masks, wherein each the photo mask includes an active area and an inactive area, the active area includes an overlap region corresponding to a stitching region of the glass substrate at a side thereof, and a plurality of alignment precision measure and check marks are disposed around the active area;

performing exposure with each the photo mask on a separate reference substrate at a corresponding position, performing measurement of the alignment precision measure and check marks formed on the reference substrate, determining whether it is necessary to modify a parameter of the exposure based on the measurement result, and obtaining accurate exposure parameter and position information of each the photo mask; and combining the accurate exposure parameter of each the photo mask, using the combined exposure parameter to perform exposure sequentially with the at least two photo masks on the same substrate at positions corresponding to the position information so as to obtain an exposed pattern, wherein for each the exposure, at least one cover plate is used to shield the alignment precision measure and check marks of the photo mask at the side of the overlap region;

wherein the exposed pattern includes at least two exposure regions corresponding to the at least two photo masks, and the stitching region is formed between adjacent two of the exposure regions.

In the method, the step of performing exposure with each the photo mask on a separate reference substrate at a corresponding position, performing measurement of the alignment precision measure and check marks formed on the reference substrate, determining whether it is necessary to modify a parameter of the exposure based on the measurement result, and obtaining accurate exposure parameter and position information of each the photo mask further includes:

comparing the measurement result with a target value, and using the newest exposure parameter of the photo mask as the accurate exposure parameter if the comparing result indicates a deviation within an acceptable range; and modifying a current exposure parameter of the photo mask and performing exposure again if the comparing result indicates a deviation beyond the acceptable range, until the comparing result indicates a deviation within the acceptable range, and using the newest exposure parameter of the photo mask as the accurate exposure parameter.

In the method, each the reference substrate has the same dimension as the glass substrate.

In the method, the step of performing exposure with each the photo mask on a separate reference substrate at a corresponding position further includes:

performing a process of etching the reference substrate and removing photoresist after exposure.

In the method, the step of performing exposure sequentially with the at least two photo masks on the same substrate at corresponding positions according to corresponding accurate exposure parameters further includes:

aligning the photo mask with the glass substrate before each exposure is performed.

The embodiments of the present invention have the following benefits:

In the embodiments of the present invention, by way of joint exposure on the large-size LCD glass substrate, and performing exposure with each the photo mask on a separate reference substrate and performing measurement of the alignment precision measure and check marks, deformation and deflection levels of the exposed pattern can be obtained. The parameter of exposure in each exposure region can be modified according to the measurement result so as to make the alignment precision of the final exposed pattern formed after the joint exposure on the glass substrate located within the specified range. Accordingly, the alignment precision in the stitching region between adjacent exposure regions can be effectively monitored, the alignment precision between the TFT array substrate and the color filter substrate can be enhanced, and the production yield of LCD panels can be increased.

BRIEF DESCRIPTION OF THE DRAWINGS

The embodiments or technical solutions of the present invention will be apparent from the following detailed descriptions with reference to the attached drawings. It is understood that the attached drawings are merely for illustrating the embodiments of the present invention, and for those ordinary in the art, further drawings can be derived from the attached drawings without inventive efforts.

DETAILED DESCRIPTION OF THE PREFERRED EMBODIMENTS

Hereinafter, detailed descriptions of preferred embodiments according to the invention are given with annexed drawings.

Figure 1:
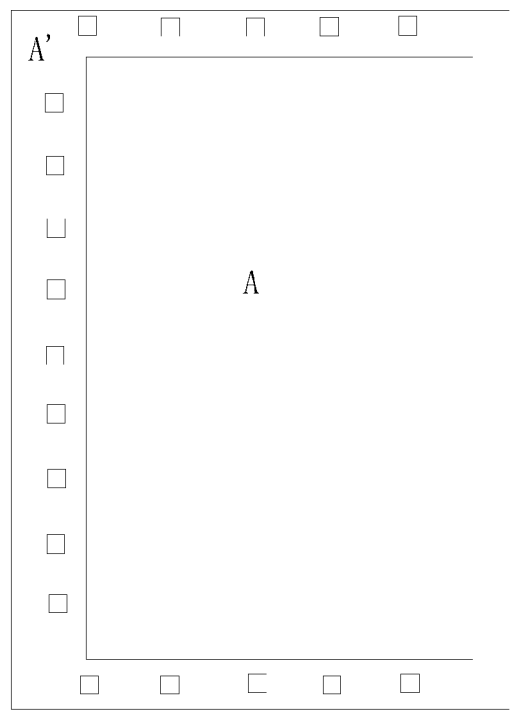
FIG. 1 is a schematic diagram illustrating a portion of photo mask used in a current exposure method of a large-size LCD glass substrate.
Figure 2:
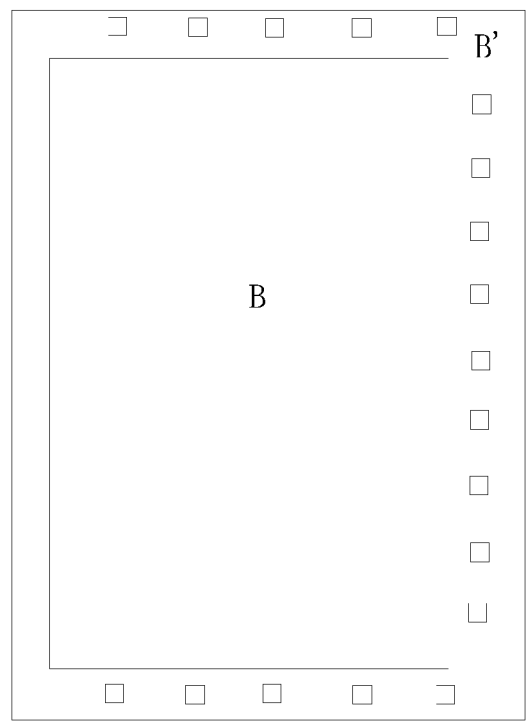
FIG. 2 is a schematic diagram illustrating another portion of photo mask used in a current exposure method of a large-size LCD glass substrate.
Figure 3:
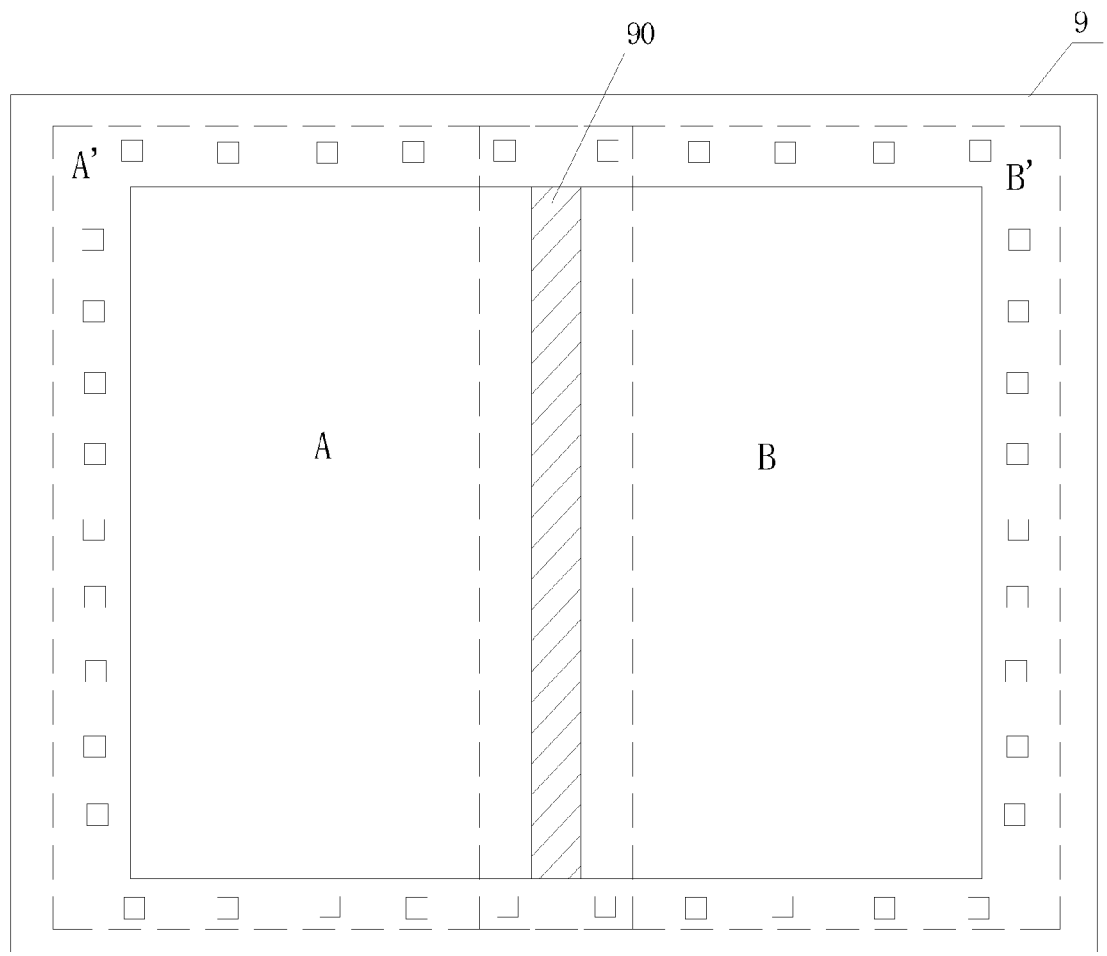
FIG. 3 is a schematic diagram illustrating the use of the photo mask portions shown in FIG. 1 and FIG. 2 to perform exposure on the glass substrate.
Figure 4:
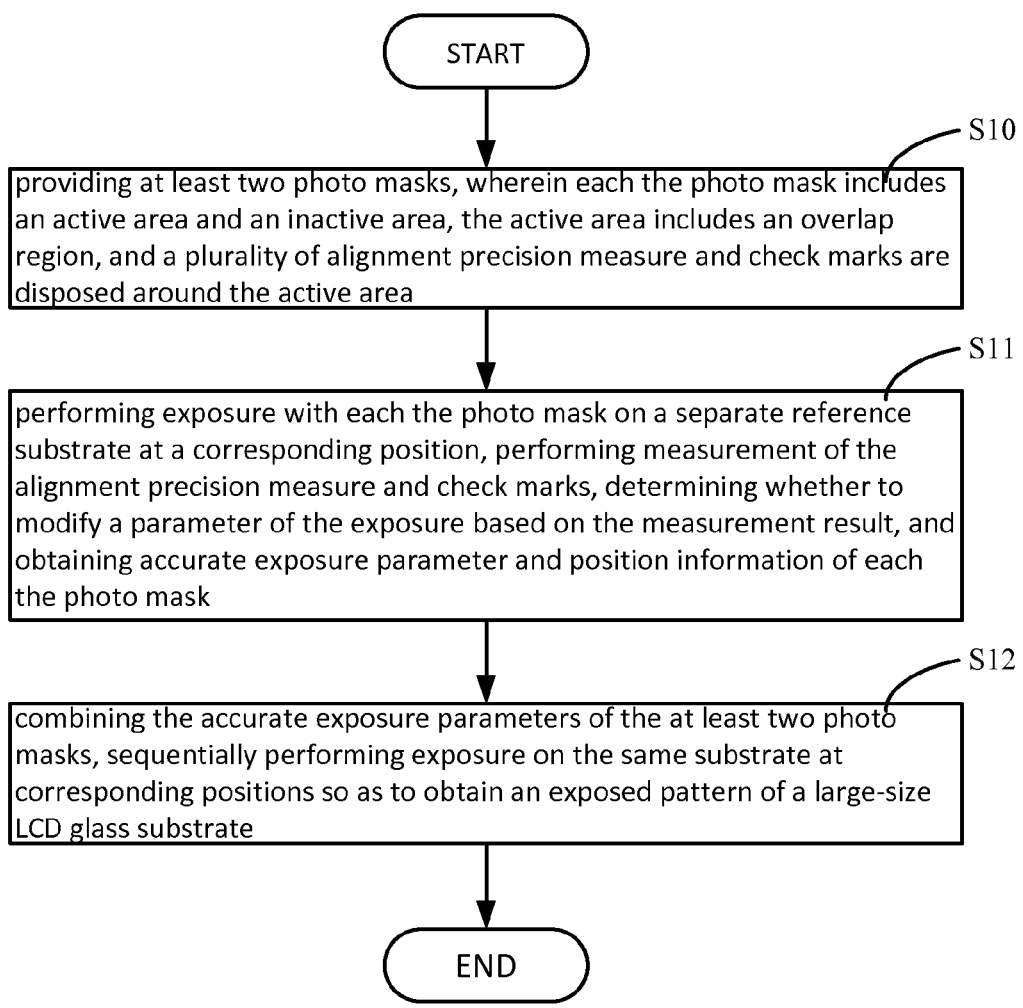
FIG. 4 is a primitive flowchart of an exposure method for a glass substrate of a liquid crystal display provided according to the present invention.

Referring to FIG. 4, which is a primitive flowchart of an exposure method for a glass substrate of a liquid crystal display provided according to an embodiment of the present invention. In this embodiment, the exposure method for a glass substrate of a liquid crystal display includes the following steps.

Figure 5:
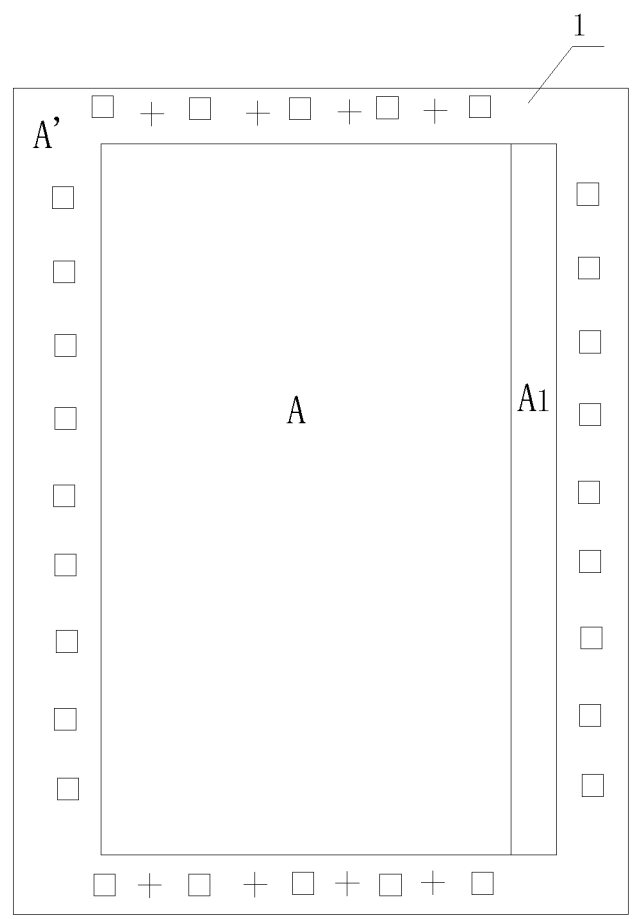
FIG. 5 is a schematic diagram of a photo mask used in FIG. 4.
Figure 6:
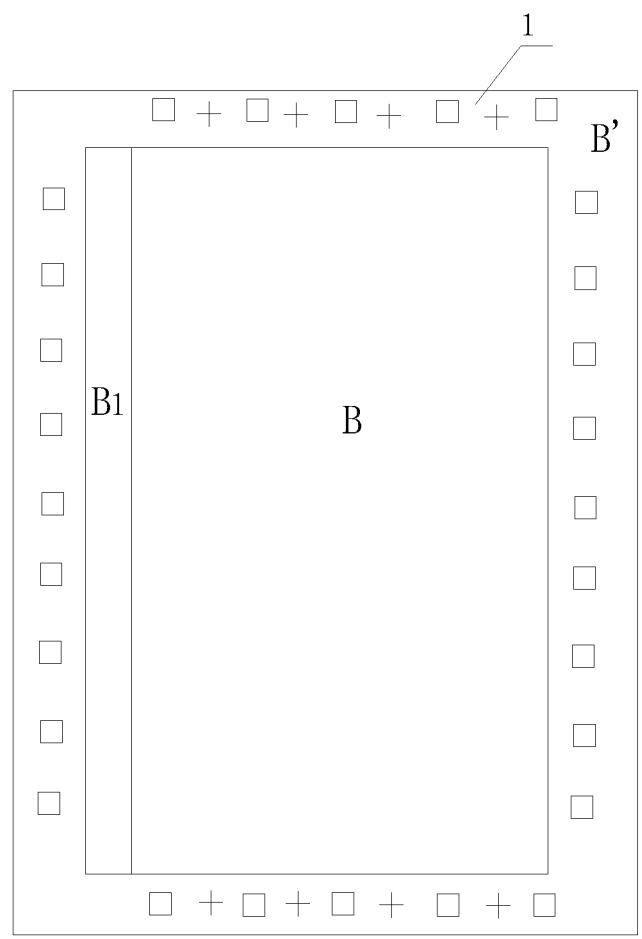
FIG. 6 is a schematic diagram of another photo mask used in FIG. 4.

In Step S10, at least two photo masks are provided. Refer to FIG. 5 and FIG. 6 for the structure of the photo masks. In the structure, each the photo mask 1 includes an active area (Area A or Area B) and an inactive area (Area A' or Area B'). An overlap region (Area A1 or Area B1) is included at a side of the active area. The overlap region is correspondingly disposed at the side of a stitching region of the glass substrate. Around the inactive area, alignment precision measurement and check marks, which are shown as small blocks in the figures, are disposed. In addition, there are alignment marks disposed at least two sides of the active area, which are shown as cross in the figure. In FIG. 5 and FIG. 6, it is the upper and lower sides of the active area where alignment marks are disposed.

Figure 7:
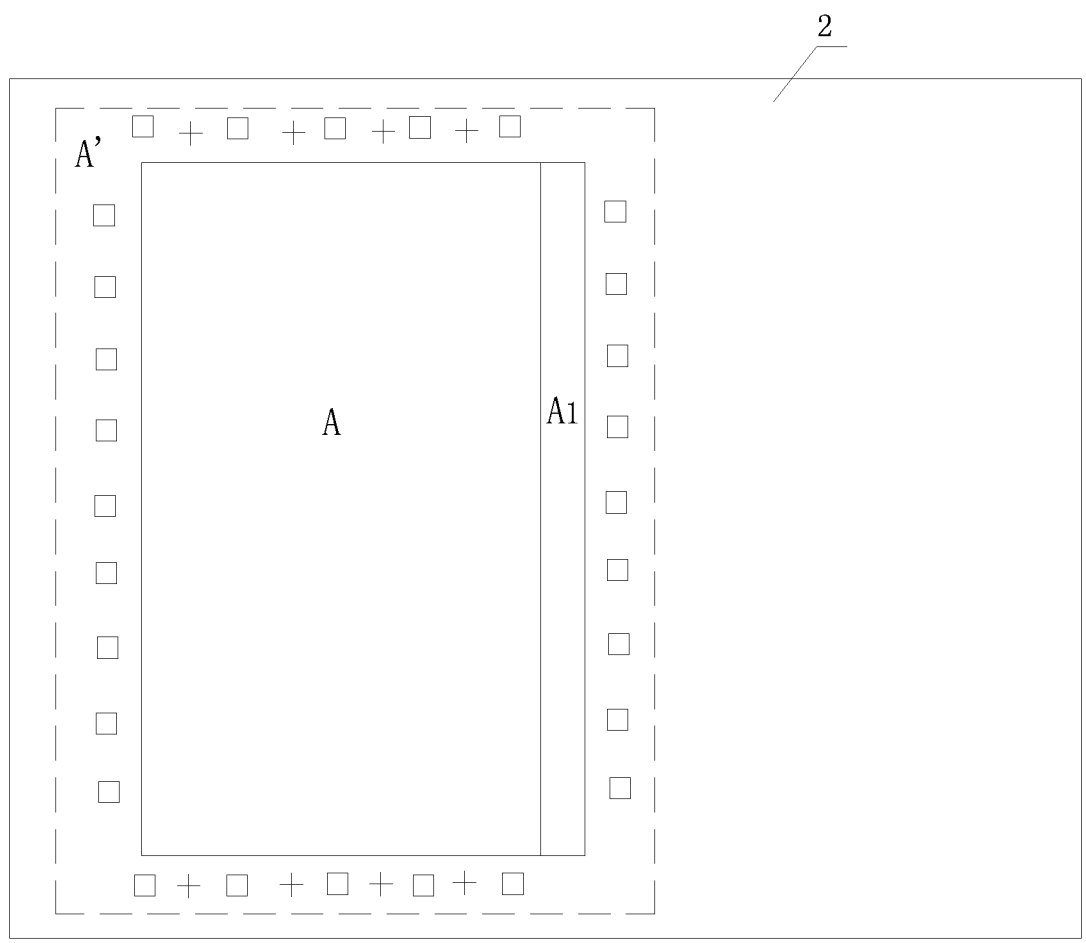
FIG. 7 is a schematic diagram illustrating the use of the photo mask shown in FIG. 5 for exposure on a reference substrate.
Figure 8:
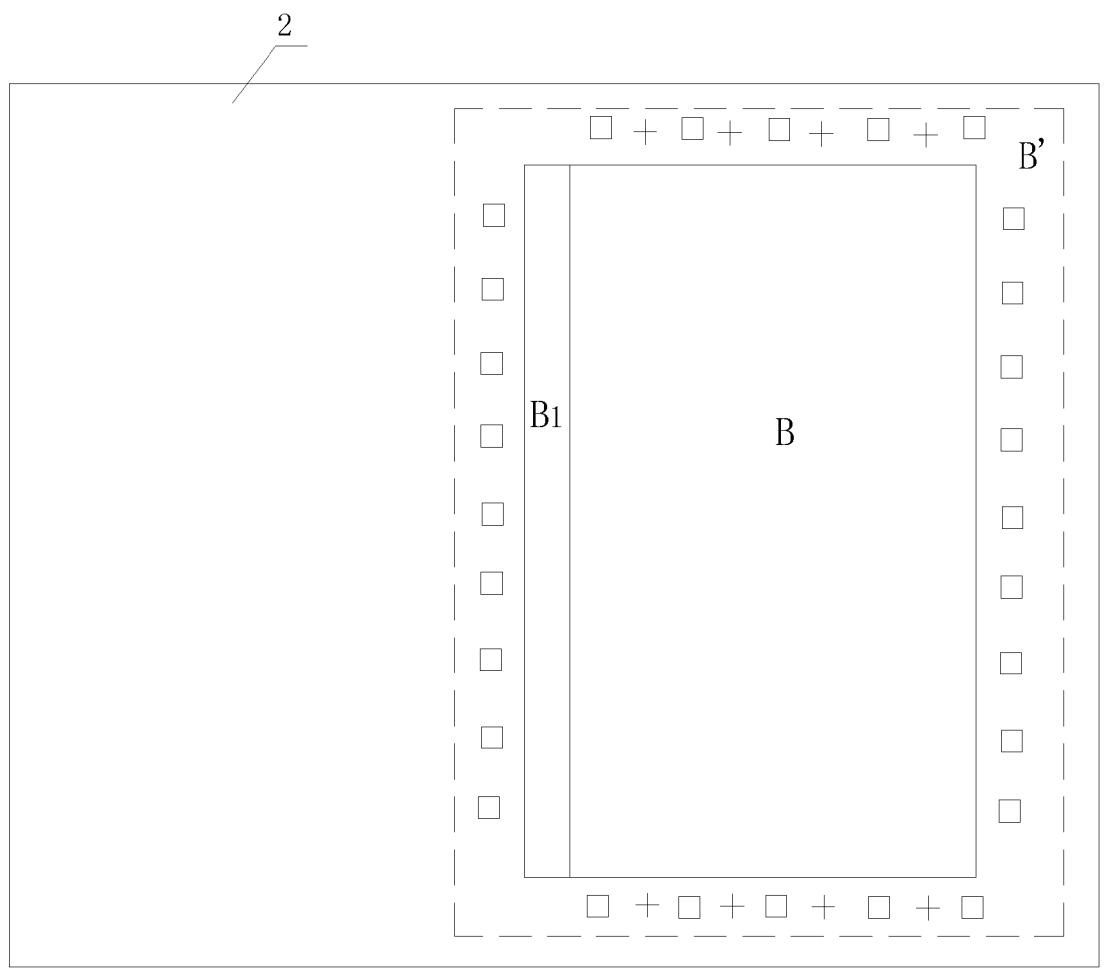
FIG. 8 is a schematic diagram illustrating the use of the photo mask shown in FIG. 6 for exposure on another reference substrate.

In Step S11, exposure is performed with each the photo mask 1 on a separate reference substrate 2 at a corresponding position. Then perform measurement of the alignment precision measure and check marks formed on the reference substrate 2 after exposure. Based on the measurement result, whether it is necessary to modify the current exposure parameter is determined to obtain accurate exposure parameter and position information of each the photo mask. Concretely, it includes:

providing at least two reference substrates 2 having the same dimension as the glass substrate to be finally used, wherein the reference substrate 2 may be made of the same material as the glass substrate, and can be reused, and wherein in an embodiment of producing an array substrate, it is necessary to coat a metal deposition layer and a photoresist on the reference substrate 2, and etch the reference substrate 2 and remove the photoresist after exposure, i.e. using the reference substrate 2 to simulate the glass substrate to conduct the masking process;

performing exposure with each the photo mask 1 on the separate reference substrate 2 at a corresponding position, as shown in FIG. 7 and FIG. 8, wherein the photo mask 1 shown in FIG. 5 is used to form an exposed pattern at the left side of one reference substrate 2 and the photo mask 1 shown in FIG. 6 is used to form an exposed pattern at the right side of another reference substrate 2, and wherein it is understood that they are only examples and it is only required that the corresponding position of the exposure region of each the photo mask is consistent to the corresponding position of the exposure region on the glass substrate;

measuring the alignment precision measure and check marks of the exposed pattern formed on the reference substrate 2, comparing the measurement result with a designed target value, and using the newest exposure parameter of the photo mask as the accurate exposure parameter if the comparing result indicates a deviation within an acceptable range; and modifying a current exposure parameter of the photo mask and performing exposure again if the comparing result indicates a deviation beyond the acceptable range, until the comparing result indicates a deviation within the acceptable range, and using the newest exposure parameter of the photo mask as the accurate exposure parameter.

In the step, the position information is the position where corresponding exposure is performed with each the photo mask 1 on the reference substrate 2. For example, the position information of the exposure with the photo mask 1 shown in FIG. 5 on the reference substrate 2 is the left side. Practically, it can be indicated by way of coordination information.

In Step S12, the accurate exposure parameters of each the photo mask are combined, and exposure is performed according to the corresponding accurate exposure parameter sequentially with the at least two photo masks on the same glass substrate 3 at positions corresponding to the position information.

Figure 9:
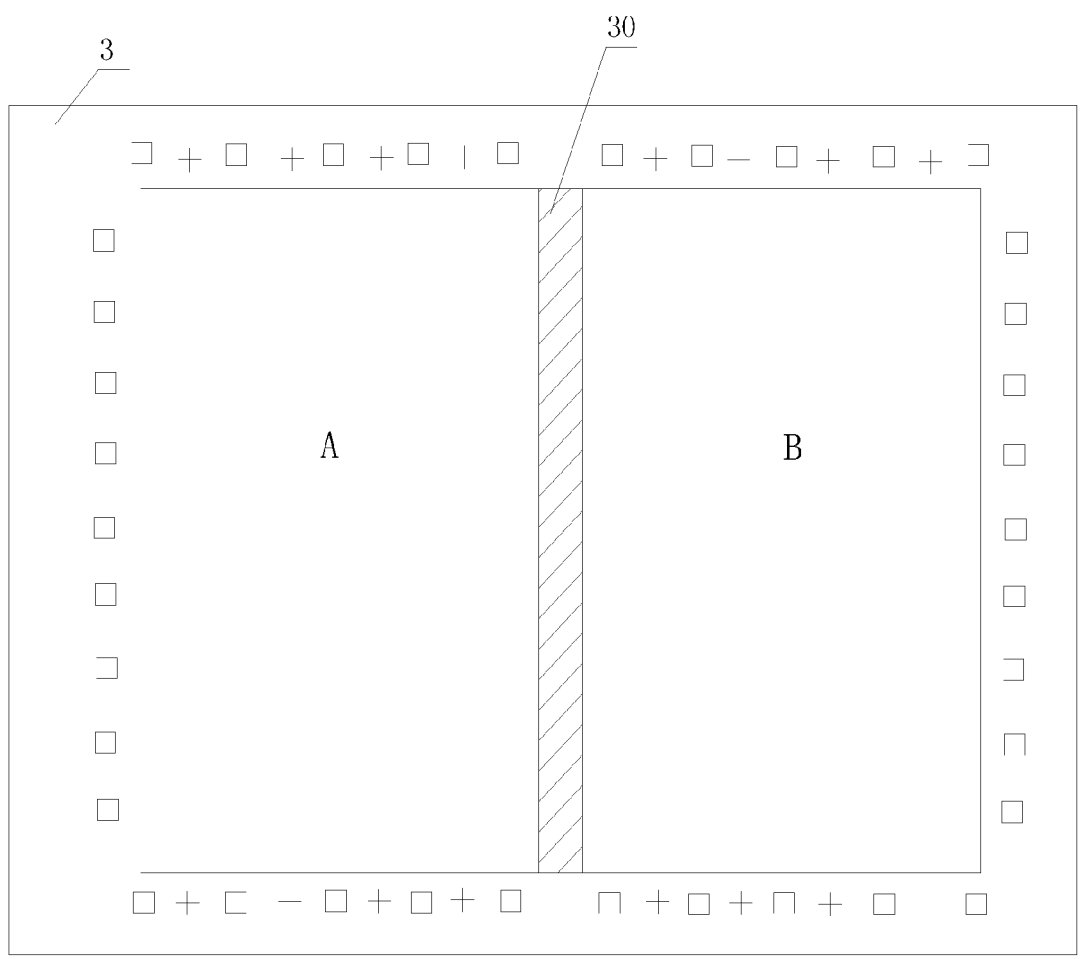
FIG. 9 is a schematic diagram illustrating the use of both the photo masks shown in FIG. 5 and FIG. 6 for exposure on a glass substrate.

Before each exposure, the positioning marks on the photo mask 1 are used for aligning with the glass substrate 3. Furthermore, during each exposure, at least one cover plate is used to shield the alignment precision measure and check marks at the side of the overlap region (Region A1 or B1) of the photo mask 1. The exposed pattern of a large-size LCD glass substrate is then obtained, as shown in FIG. 9, in which the exposed pattern includes a stitching region 30 corresponding to the exposure region of each the photo mask and formed between adjacent two exposure regions.

The embodiments of the present invention have the following benefits:

In the embodiments of the present invention, by way of joint exposure on the large-size LCD glass substrate, and performing exposure with each the photo mask on a separate reference substrate and performing measurement of the alignment precision measure and check marks, deformation and deflection levels of the exposed pattern can be obtained. The parameter of exposure in each exposure region can be modified according to the measurement result so as to make the alignment precision of the final exposed pattern formed after the joint exposure on the glass substrate located within the specified range. Accordingly, the alignment precision in the stitching region between adjacent exposure regions can be effectively monitored, the alignment precision between the TFT array substrate and the color filter substrate can be enhanced, and the production yield of LCD panels can be increased.

Those disclosed above are only preferred embodiments according to the present invention and should not be used for limiting the scope of the invention. All the equivalent variations are considered within the scope of the invention.

What is claimed is:

1. An exposure method for a glass substrate of a liquid crystal display, comprising:

providing at least two photo masks, wherein each the photo mask includes an active area and an inactive area, the active area includes an overlap region corresponding to a stitching region of the glass substrate at a side thereof, and a plurality of alignment precision measure and check marks are disposed around the active area;

performing exposure with each the photo mask on a separate reference substrate at a corresponding position, performing measurement of the alignment precision measure and check marks formed on the reference substrate, determining whether it is necessary to modify a parameter of the exposure based on the measurement result, and obtaining accurate exposure parameter and position information of each the photo mask; and combining the accurate exposure parameter of each the photo mask, using the combined exposure parameter to perform exposure sequentially with the at least two photo masks on the same substrate at positions corresponding to the position information so as to obtain an exposed pattern, wherein for each the exposure, at least one cover plate is used to shield the alignment precision measure and check marks of the photo mask at the side of the overlap region.

2. The exposure method for a glass substrate of a liquid crystal display according to claim 1, wherein the step of performing exposure with each the photo mask on a separate reference substrate at a corresponding position, performing measurement of the alignment precision measure and check marks formed on the reference substrate, determining whether it is necessary to modify a parameter of the exposure based on the measurement result, and obtaining accurate exposure parameter and position information of each the photo mask further includes:

comparing the measurement result with a target value, and using the newest exposure parameter of the photo mask as the accurate exposure parameter if the comparing result indicates a deviation within an acceptable range; and modifying a current exposure parameter of the photo mask and performing exposure again if the comparing result indicates a deviation beyond the acceptable range, until the comparing result indicates a deviation within the acceptable range, and using the newest exposure parameter of the photo mask as the accurate exposure parameter.

3. The exposure method for a glass substrate of a liquid crystal display according to claim 2, wherein the exposed pattern includes at least two exposure regions corresponding to the at least two photo masks, and the stitching region is formed between adjacent two of the exposure regions.

4. The exposure method for a glass substrate of a liquid crystal display according to claim 3, wherein the glass substrate is a thin film transistor array substrate or a color filter substrate.

5. The exposure method for a glass substrate of a liquid crystal display according to claim 4, wherein each the reference substrate has the same dimension as the glass substrate.

6. The exposure method for a glass substrate of a liquid crystal display according to claim 5, wherein the step of performing exposure with each the photo mask on a separate reference substrate at a corresponding position further includes:
   performing a process of etching the reference substrate and removing photoresist after exposure.

7. The exposure method for a glass substrate of a liquid crystal display according to claim 6, wherein the step of performing exposure sequentially with the at least two photo masks on the same substrate at corresponding positions according to corresponding accurate exposure parameters further includes:
   aligning the photo mask with the glass substrate before each exposure is performed.

8. An exposure method for a glass substrate of a liquid crystal display, comprising:
   providing at least two photo masks, wherein each the photo mask includes an active area and an inactive area, the active area includes an overlap region corresponding to a stitching region of the glass substrate at a side thereof, and a plurality of alignment precision measure and check marks are disposed around the active area;
   performing exposure with each the photo mask on a separate reference substrate at a corresponding position, performing measurement of the alignment precision measure and check marks formed on the reference substrate, determining whether it is necessary to modify a parameter of the exposure based on the measurement result, and obtaining accurate exposure parameter and position information of each the photo mask; and
   combining the accurate exposure parameter of each the photo mask, using the combined exposure parameter to perform exposure sequentially with the at least two photo masks on the same substrate at positions corresponding to the position information so as to obtain an exposed pattern, wherein for each the exposure, at least one cover plate is used to shield the alignment precision measure and check marks of the photo mask at the side of the overlap region;
   wherein the exposed pattern includes at least two exposure regions corresponding to the at least two photo masks, and the stitching region is formed between adjacent two of the exposure regions.

9. The exposure method for a glass substrate of a liquid crystal display according to claim 8, wherein the step of performing exposure with each the photo mask on a separate reference substrate at a corresponding position, performing measurement of the alignment precision measure and check marks formed on the reference substrate, determining whether it is necessary to modify a parameter of the exposure based on the measurement result, and obtaining accurate exposure parameter and position information of each the photo mask further includes:
   comparing the measurement result with a target value, and using the newest exposure parameter of the photo mask as the accurate exposure parameter if the comparing result indicates a deviation within an acceptable range; and
   modifying a current exposure parameter of the photo mask and performing exposure again if the comparing result indicates a deviation beyond the acceptable range, until the comparing result indicates a deviation within the acceptable range, and using the newest exposure parameter of the photo mask as the accurate exposure parameter.

10. The exposure method for a glass substrate of a liquid crystal display according to claim 9, wherein each the reference substrate has the same dimension as the glass substrate.

11. The exposure method for a glass substrate of a liquid crystal display according to claim 10, wherein the step of performing exposure with each the photo mask on a separate reference substrate at a corresponding position further includes:
   performing a process of etching the reference substrate and removing photoresist after exposure.

12. The exposure method for a glass substrate of a liquid crystal display according to claim 11, wherein the step of performing exposure sequentially with the at least two photo masks on the same substrate at corresponding positions according to corresponding accurate exposure parameters further includes:
   aligning the photo mask with the glass substrate before each exposure is performed.

* * * * *